(12) United States Patent
Huang

(10) Patent No.: US 11,526,079 B2
(45) Date of Patent: Dec. 13, 2022

(54) BACKPLANE UNIT AND ITS MANUFACTURING METHOD AND DISPLAY DEVICE

(71) Applicant: TCL CHINA STAR OPTOELECTRONICS TECHNOLOGY CO., LTD., Guangdong (CN)

(72) Inventor: Wei Huang, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 239 days.

(21) Appl. No.: 16/955,098

(22) PCT Filed: May 19, 2020

(86) PCT No.: PCT/CN2020/090977
§ 371 (c)(1),
(2) Date: Jun. 18, 2020

(87) PCT Pub. No.: WO2021/208179
PCT Pub. Date: Oct. 21, 2021

(65) Prior Publication Data
US 2021/0318617 A1 Oct. 14, 2021

(30) Foreign Application Priority Data
Apr. 14, 2020 (CN) .......................... 202010291073.6

(51) Int. Cl.
*G03F 7/00* (2006.01)
*G03F 7/11* (2006.01)
(Continued)

(52) U.S. Cl.
CPC .................. *G03F 7/11* (2013.01); *G03F 7/09* (2013.01); *G09F 13/04* (2013.01); *G09F 13/22* (2013.01);
(Continued)

(58) Field of Classification Search
CPC ....... H01L 27/156; H01L 33/46; G09F 13/04; G09F 13/22
See application file for complete search history.

(56) References Cited

U.S. PATENT DOCUMENTS

| 6,111,356 A | 8/2000 | Roitman et al. |
| 10,224,349 B1 | 3/2019 | Ou et al. |
| (Continued) | | |

FOREIGN PATENT DOCUMENTS

| CN | 103123896 A | 5/2013 |
| CN | 104898886 A | 9/2015 |
| (Continued) | | |

*Primary Examiner* — Gerald J Sufleta, II
(74) *Attorney, Agent, or Firm* — PV IP PC; Wei Te Chung; Ude Lu

(57) ABSTRACT

The present application provides a backplane unit, a manufacturing method thereof, and a display device. The manufacturing method includes the following steps: forming a photoresist layer on an array substrate; performing exposure on at least a portion of the photoresist layer corresponding to a light-emitting element; forming a light-shielding layer on at least a side of the photoresist layer away from the array substrate, wherein the light-shielding layer exposes at least a side portion of the light-emitting element; and laterally stripping the photoresist layer on the light-emitting element with a stripping solution to obtain the backplane unit.

17 Claims, 3 Drawing Sheets

(51) Int. Cl.
    *H01L 27/15*     (2006.01)
    *H01L 33/46*     (2010.01)
    *G09F 13/04*     (2006.01)
    *G09F 13/22*     (2006.01)
    *G03F 7/09*     (2006.01)

(52) U.S. Cl.
    CPC ............ *H01L 27/156* (2013.01); *H01L 33/46* (2013.01); *G09F 2013/222* (2013.01)

(56) References Cited

U.S. PATENT DOCUMENTS

| | | | |
|---|---|---|---|
| 10,510,815 | B2 | 12/2019 | Liu |
| 2013/0146880 | A1 | 6/2013 | Liu |
| 2016/0141349 | A1* | 5/2016 | Yun ............... H01L 27/3258 438/23 |
| 2017/0168616 | A1* | 6/2017 | Feng ............... G06F 3/0412 |
| 2018/0122877 | A1* | 5/2018 | Beak ............... H01L 27/3248 |
| 2018/0226508 | A1* | 8/2018 | Chen ............... H01L 27/3274 |
| 2018/0348627 | A1* | 12/2018 | Hwang ............... G03F 1/38 |
| 2019/0036084 | A1 | 1/2019 | Lee |
| 2019/0229017 | A1* | 7/2019 | Liu ............... H01L 27/3258 |
| 2020/0058631 | A1* | 2/2020 | Chen ............... H01L 25/0753 |
| 2021/0135154 | A1* | 5/2021 | Liu ............... H01L 51/5246 |
| 2021/0210535 | A1* | 7/2021 | Jiang ............... H01L 27/14632 |

FOREIGN PATENT DOCUMENTS

| | | | | |
|---|---|---|---|---|
| CN | 105609528 | A | 5/2016 | |
| CN | 105957976 | A | 9/2016 | |
| CN | 106653768 | A | 5/2017 | |
| CN | 107104108 | A | 8/2017 | |
| CN | 206627737 | U | 11/2017 | |
| CN | 107689345 | A | 2/2018 | |
| CN | 107785382 | A | 3/2018 | |
| CN | 108183156 | A | 6/2018 | |
| CN | 109065455 | A | 12/2018 | |
| CN | 109148717 | A | 1/2019 | |
| CN | 109791451 | A | 5/2019 | |
| CN | 109791451 | A * | 5/2019 | ............ G03F 7/004 |
| CN | 110034149 | A | 7/2019 | |
| CN | 110187614 | A | 8/2019 | |
| CN | 110391261 | A | 10/2019 | |
| CN | 110494985 | A | 11/2019 | |
| CN | 110838497 | A | 2/2020 | |
| CN | 110989859 | A | 4/2020 | |
| CN | 110993564 | A | 4/2020 | |
| EP | 0951073 | B1 | 4/2005 | |
| KR | 20190108769 | A | 9/2019 | |

* cited by examiner

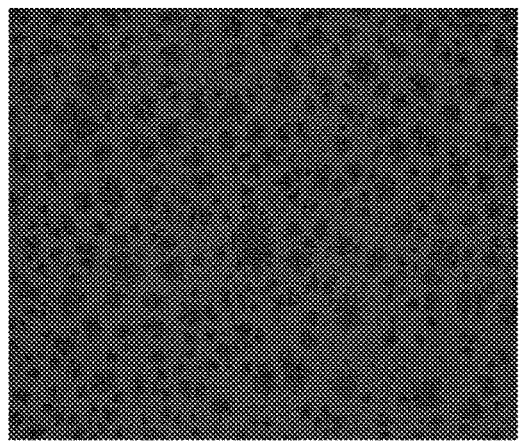

FIG. 1 (Prior art)

forming a photoresist layer on an array substrate, wherein the array substrate comprises a substrate, an array layer, and a light-emitting element, the array layer is formed on the substrate, the light-emitting element is disposed on the array layer, and the photoresist layer is formed on a side of the array layer and the light-emitting element away from the substrate; — S100 performing exposure on at least a portion of the photoresist layer corresponding to the light-emitting element; — S101 forming a light-shielding layer on at least a side of the photoresist layer away from the array substrate, wherein the light-shielding layer exposes at least a side portion of the light-emitting element; and — S102 laterally stripping the photoresist layer on the light-emitting — S103

FIG. 2

# BACKPLANE UNIT AND ITS MANUFACTURING METHOD AND DISPLAY DEVICE

BACKGROUND OF INVENTION

Field of Invention

The present application relates to a field of display technology, and in particular, to a backplane unit, a manufacturing method thereof, and a display device.

Description of Prior Art

At present, a black matrix layer is required to serve as a light-shielding layer in a manufacturing process of a mini-LED backplane to prevent performance of a device on the mini-LED backplane from impact by light incident on the mini-LED backplane. The light-shielding layer needs to be manufactured through steps such as cleaning, gluing, exposure, and development. As shown in FIG. 1, it is a schematic diagram of a copper metal pad corroded by a developer in the conventional technology. During the development process, the developer will corrode the metal pad exposed for soldering the mini-LED on the mini-LED backplane, causing part of the metal to diffuse into an organic black organic layer to form a development barrier, resulting in residual organic black organic layer.

Therefore, there is a need to propose a technical solution to solve the problem of residual organic black organic layer caused by corrosion of the exposed metal pad by the developer when the black organic layer is patterned.

SUMMARY OF INVENTION

An object of the present application is to provide a backplane unit, a manufacturing method thereof, and a display device, so as to avoid the problem of corrosion of the exposed metal layer when the black organic layer is developed by the conventional developer.

In order to achieve the above object, the present application provides a method of manufacturing a backplane unit. The manufacturing method includes the following steps:

forming a photoresist layer on an array substrate, wherein the array substrate comprises a substrate, an array layer, and a light-emitting element, the array layer is formed on the substrate, the light-emitting element is disposed on the array layer, and the photoresist layer is formed on a side of the array layer and the light-emitting element away from the substrate;

performing exposure on at least a portion of the photoresist layer corresponding to the light-emitting element;

forming a light-shielding layer on at least a side of the photoresist layer away from the array substrate, wherein the light-shielding layer exposes at least a side portion of the light-emitting element; and laterally stripping the photoresist layer on the light-emitting element with a stripping solution to obtain the backplane unit.

In the method of manufacturing the backplane unit, the step of performing exposure on at least a portion of the photoresist layer corresponding to the light-emitting element comprises the following steps:

performing exposure on an entire surface of the photoresist layer.

In the method of manufacturing the backplane unit, a cross section of the portion of the photoresist layer corresponding to the light-emitting element has a shape of an inverted trapezoid.

In the method of manufacturing the backplane unit, the step of forming a light-shielding layer on at least a side of the photoresist layer away from the array substrate comprises the following step:

forming a protective layer on the at least one side of the photoresist layer away from the array substrate, wherein the protective layer comprises a reflective layer.

In the method of manufacturing the backplane unit, the protective layer is formed by at least one of chemical deposition and physical deposition.

In the method of manufacturing the backplane unit, the reflective layer is a metal layer.

In the method of manufacturing the backplane unit, the step of forming a light-shielding layer on at least a side of the photoresist layer away from the array substrate comprises the following step:

forming a black organic layer on the side of the photoresist layer away from the array substrate, and a sum of a thickness of the black organic layer and a thickness of the photoresist layer is smaller than a height of the light-emitting element.

In the method of manufacturing the backplane unit, the stripping solution comprises monoethanolamine and dimethyl sulfoxide.

In the method of manufacturing the backplane unit, the light-emitting element is any one of a sub-millimeter light-emitting diode, a micro-light-emitting diode, and a light-emitting diode.

In the method of manufacturing the backplane unit, a thickness of the photoresist layer ranges from 1 micrometer to 5 micrometers.

A backplane unit, comprising an array substrate, a photoresist layer, and a light-shielding layer, wherein the array substrate comprises a substrate, an array layer, and a light-emitting element, the array layer is disposed on the substrate, and the light-emitting element is disposed on the array layer;

the photoresist layer is formed on a side of the array layer away from the substrate; and the light-shielding layer covers the photoresist layer.

In the backplane unit, the light-shielding layer comprises a protective layer, and the protective layer comprises a reflective layer.

In the backplane unit, the light-shielding layer further comprises a black organic layer disposed between the protective layer and the photoresist layer.

In the backplane unit, a sum of a thickness of the black organic layer and a thickness of the photoresist layer is smaller than a height of the light-emitting element.

In the backplane unit, the thickness of the black organic layer ranges from 0.8 micrometers to 1.2 micrometers, and the thickness of the photoresist layer ranges from 1 micrometer to 5 micrometers.

In the backplane unit, the backplane unit is a display panel or a backlight module.

A display device, wherein the display device comprises a backplane unit, and the backplane unit comprises an array substrate, a photoresist layer, and a light-shielding layer;

the array substrate comprises a substrate, an array layer, and a light-emitting element, the array layer is formed on the substrate, and the light-emitting element is disposed on the array layer;

the photoresist layer is formed on a side of the array layer and the light-emitting element away from the substrate; and the light-shielding layer covers the photoresist layer.

In the display device, the light-shielding layer comprises a protective layer, and the protective layer comprises a reflective layer.

In the display device, the light-shielding layer further comprises a black organic layer disposed between the protective layer and the photoresist layer.

In the display device, a sum of a thickness of the black organic layer and a thickness of the photoresist layer is smaller than a height of the light-emitting element.

Advantageous Effects

The present application provides a backplane unit, a manufacturing method thereof, and a display device. The manufacturing method includes the following steps: forming a photoresist layer on an array substrate, wherein the array substrate comprises a substrate, an array layer, and a light-emitting element, the array layer is formed on the substrate, the light-emitting element is disposed on the array layer, and the photoresist layer is formed on a side of the array layer and the light-emitting element away from the substrate; performing exposure on at least a portion of the photoresist layer corresponding to the light-emitting element; forming a light-shielding layer on at least a side of the photoresist layer away from the array substrate, wherein the light-shielding layer exposes at least a side portion of the light-emitting element; and laterally stripping the photoresist layer on the light-emitting element with a stripping solution to obtain the backplane unit. The height of the light-emitting element is greater than the thickness of the array layer, the side of the photoresist layer on the light-emitting element is exposed, and the exposed photoresist layer on the light-emitting element is laterally penetrated and stripped by the stripping solution, wherein the stripping solution will not corrode the metal, such that the problem of corrosion of the exposed metal layer when the black organic layer is developed by the conventional developer is avoided. Moreover, since the light-shielding layer is patterned after the light-emitting element is disposed on the array layer, oxidation of the exposed metal caused by a baking process of a patterning process of the black organic layer in the conventional technology can be avoided, which impacts the effect of welding the light-emitting element on the metal. In addition, after the light-shielding layer is formed after disposing the light-emitting element on the array layer, a redundant space for placing the light-emitting element can be prevented from being covered by the subsequently formed light-shielding layer, such that light leakage generates in the redundant space around the light-emitting element in the conventional technology due to that the light-emitting element is bound after forming the light-shielding layer.

BRIEF DESCRIPTION OF DRAWINGS

FIG. 1 is a schematic diagram of a copper metal pad corroded by a developer in the conventional technology.

FIG. 2 is a schematic flowchart of a method of manufacturing a backplane unit according to an embodiment of the present application.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Referring to FIG. 2, which is a schematic flowchart of a method of manufacturing a backplane unit according to an embodiment of the present application. The method of manufacturing the backplane unit includes the following steps:

S100: forming a photoresist layer on an array substrate, wherein the array substrate comprises a substrate, an array layer, and a light-emitting element, the array layer is formed on the substrate, the light-emitting element is disposed on the array layer, and the photoresist layer is formed on a side of the array layer and the light-emitting element away from the substrate.

Figure 3A:
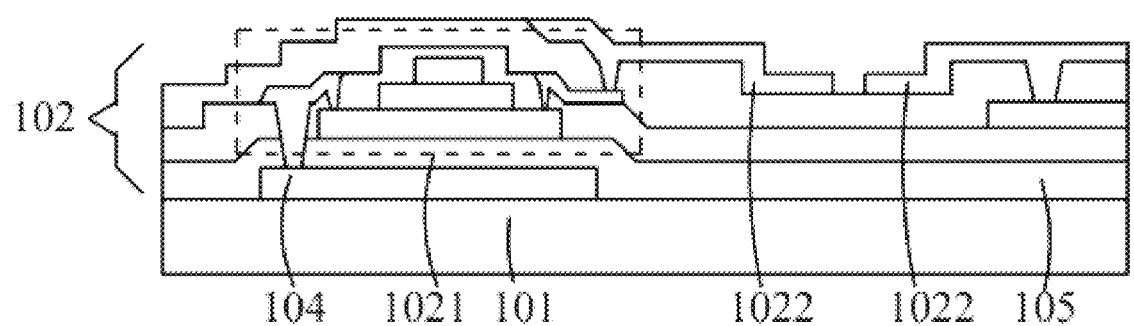
FIGS. 3A-3E are schematic diagrams of a process of manufacturing a backplane unit according to the schematic flowchart shown in FIG. 2.
Figure 3B:
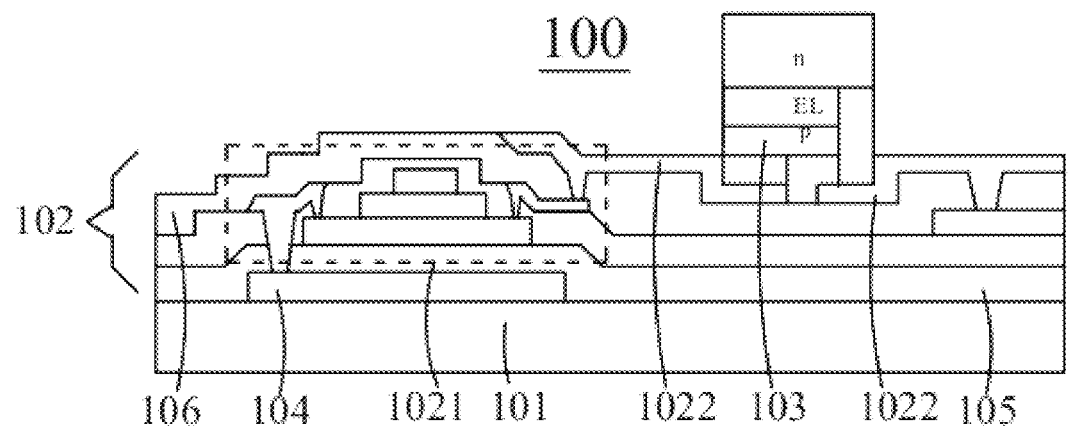

As shown in FIG. 3B, the array substrate 100 includes a substrate 101, an array layer 102, and a light-emitting element 103. As shown in FIG. 3A, the array layer 102 includes a plurality of thin film transistors 1021 arranged in an array on the substrate 101 and two conductive electrodes 1022 arranged on the substrate 101. The light-emitting element 103 is connected to the two conductive electrodes 1022.

Each of the thin film transistors 1021 may be a back channel etching (BCE) thin film transistor or an etching stop layer (ESL) thin film transistor. Each of the thin film transistors may be a low temperature polysilicon thin film transistor, a metal oxide thin film transistor, or an amorphous silicon thin film transistor. Each of the thin film transistors may be a bottom-gate thin film transistor or a top-gate thin film transistor.

In order to prevent light incident on the substrate 101 from being incident into an active layer of the thin film transistor 1021 and impacting electrical performance of the thin film transistor, a light-shielding layer 104 is provided on the substrate 101 corresponding to the active layer of the thin film transistor. A buffer layer 105 is provided between the array layer 102 and the light-shielding layer to prevent ions in the substrate 101 from diffusing into the thin film transistor 1021 and impacting the electrical performance of the thin film transistor 1021.

Specifically, the thin film transistors 1021 are back-channel etched thin film transistors, the thin film transistors are metal oxide thin film transistors, and the thin film transistors are top-gate thin film transistors. The active layer of each of the thin film transistors 1021 is made of indium gallium zinc oxide (IGZO). Each of the thin film transistors 1021 includes an active layer disposed on the buffer layer 105, a gate insulating layer formed on the active layer, a gate formed on the gate insulating layer, a interlayer insulating layer and a source/drain covering the active layer, the gate insulating layer, and the gate, sequentially.

the source is in contact with the active layer through a via hole on the interlayer insulating layer and connected to the light-shielding layer 104 through a via hole communicating the interlayer insulating layer and the buffer layer 105, and the drain is connected to the active layer through a via hole on the interlayer insulating layer.

The array layer 102 further includes a conductive member provided in the same layer as the source/drain. The conductive member and the source/drain are formed by the same process. The array layer 102 further includes a passivation layer 106 covering the source/drain and the conductive member.

The two conductive electrodes 1022 are formed on the passivation layer 106, wherein one of the conductive electrodes 1022 is connected to the drain through a via hole in the passivation layer 106, and the other one of the conductive electrodes 1022 is connected to the conductive member through a via hole in the passivation layer 106. The conductive electrode 1022 includes an indium tin oxide layer, a molybdenum layer, and a copper layer disposed on the passivation layer 106 in sequence. The two conductive electrodes 1022 are connected to the light-emitting element 103 through a solder or an organic conductive film.

The light-emitting element 103 is any one of a sub-millimeter light-emitting diode (Mini-LED), a micro light-emitting diode (Micro-LED), and a light-emitting diode (LED). A size of the sub-millimeter light-emitting diode is in an order of microns (100 microns to 200 microns), for example, 100 microns×100 microns. A size of the light-emitting diode is in an order of millimeters (mm), for example, 3 mm×3 mm. A size of the micro light-emitting diode is less than 100 microns. After the array layer 102 is completed, when the light-emitting element 103 is a sub-millimeter light-emitting diode, the light-emitting element 103 is realized by surface mount technology (SMT) LED transfer or mass transfer. Generally, a space around the conductive electrode 1022 for binding the light-emitting element 103 is larger than a size of the light-emitting element 103, so that there is a redundant space when the light-emitting element 103 is provided. Therefore, by completing the binding of the light emitting element 103 after completing the array layer 102, the subsequent formation of the light-shielding layer is facilitated to cover the redundant space, while in the conventional technology, the light-shielding layer is completed before the light-emitting element is bound, resulting in light leakage in the redundant space.

It should be noted that, generally, the array layer 102 is composed of layers having a thickness mostly in the order of nanometers. After the light-emitting element 103 is disposed on the array layer 102, since the height of the light-emitting element 103 is much greater than the thickness of the array layer 102, a significant step difference may be formed between the light-emitting element 103 and the array layer 102.

Figure 3C:
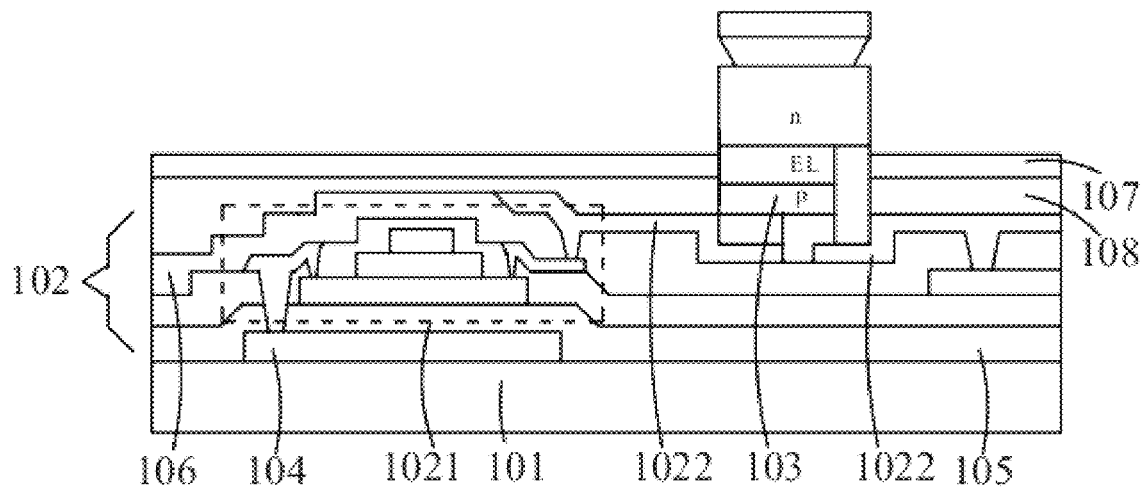

Specifically, as shown in FIG. 3C, a photoresist layer 108 is formed on a surface of the array layer 102 and the light-emitting element 103 away from the substrate 101 by coating. A thickness of the photoresist layer 108 ranges from 1 micrometer to 5 micrometers, for example, the thickness of the photoresist layer 108 is 3 micrometers. The photoresist layer 108 is made of a positive photoresist material. On the one hand, the photoresist layer 108 plays a role of reducing the step difference, which is beneficial to the subsequent packaging of the light-emitting element 103, and on the other hand, the photoresist layer 108 is laterally stripped the photoresist layer with a stripping solution, such that the light-shielding layer on the photoresist 108 is also stripped. The use of the photoresist layer 108 makes it possible to strip the photoresist layer without using a corrosive developer such as potassium hydroxide, but using the stripping solution that does not have a corrosive effect.

Further, a cross section of a portion of the photoresist layer 108 corresponding to the light-emitting element 103 has a shape of an inverted trapezoid, so that the stripping solution can more easily penetrate into a bottom of the photoresist layer 108 on the light-emitting element 103, to remove the portion of the photoresist layer 108 corresponding to the light-emitting element 103.

S101: performing exposure on at least a portion of the photoresist layer corresponding to the light-emitting element.

By exposing the portion of the photoresist layer 108 corresponding to the light-emitting element 103, the subsequent stripping solution can remove the portion of the photoresist layer 108 corresponding to the light-emitting element 103, thereby removing the light-shielding layer on the photoresist layer 108 on the light-emitting element 103, such that the light emission of the light-emitting element is prevented from being impacted by the light-shielding layer.

Further, the entire surface of the photoresist layer 108 is exposed. By exposing the entire surface of the photoresist layer 108, one mask process can be deleted, and the manufacturing process of the backplane unit is simplified.

S102: forming a light-shielding layer on at least a side of the photoresist layer away from the array substrate, wherein the light-shielding layer exposes at least a side portion of the light-emitting element.

In this embodiment, the protective layer 109 may be formed on at least one side of the photoresist layer away from the array substrate. The protective layer 109 includes a reflective layer to form a light-shielding layer. The protective layer 109 is configured to protect the photoresist layer 108 on the array layer 102 to prevent the photoresist layer 108 on the array layer 102 from being corroded when the photoresist layer 108 on the light-emitting element 103 is peeled off. The black organic layer 107 may also be formed on the side of the photoresist layer 108 away from the array substrate 100 to form a light-shielding layer. A sum of the thickness of the black organic layer 107 and the thickness of the photoresist layer 108 is smaller than a height of the light-emitting element 103, so as to facilitate the formation of a step between the light-emitting element 103 and the black organic layer 107 on the array layer 102. The light-shielding effect, On the other hand, the black organic layer 107 plays a role of reducing the light-shielding effect, and on the other hand, the black organic layer 107 plays a role of reducing the step difference, which is advantageous for the subsequent packaging of the light-emitting element 103.

Further, a sum of a thickness of the black organic layer 107 and a thickness of the photoresist layer 108 is smaller than a height of the PN junction of the light-emitting element 103.

Specifically, as shown in FIG. 3C, after the photoresist layer 108 is formed, a black organic layer 107 is formed on the side of the array layer 102 and the light-emitting element 103 away from the substrate 101 by coating a black organic material on the photoresist layer 108. The thickness of the black organic layer 107 ranges from 0.8 μm to 1.2 μm, for example, the thickness of the black organic layer 107 is 1 μm. The black organic layer 107 is the same as the conventional black matrix layer. After the black organic layer 107 is completed, the entire surface of the black organic layer 107 is exposed, and the entire surface of the photoresist layer 108 is also exposed.

Figure 3D:
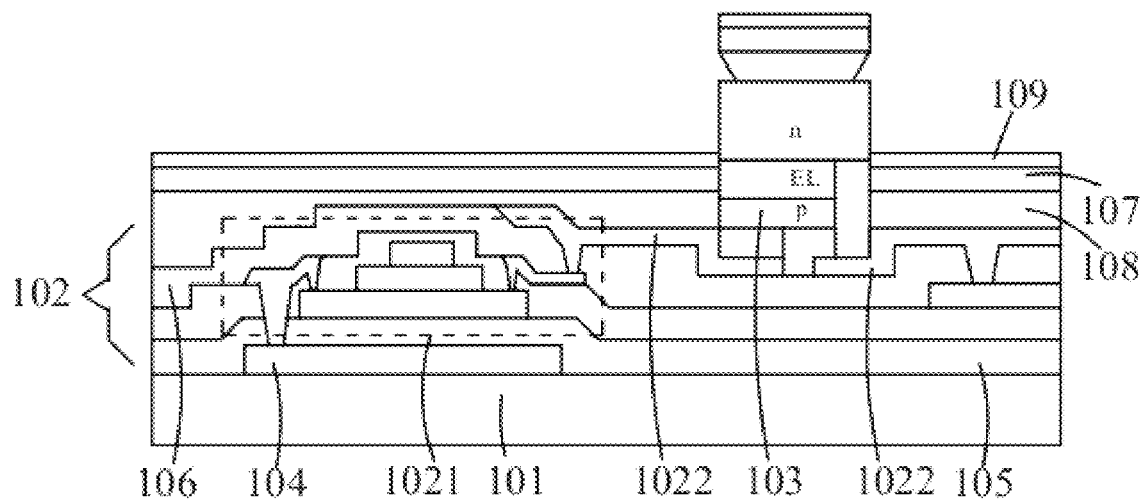

As shown in FIG. 3D, at least one of chemical deposition and physical deposition is used to form the protective layer 109. The protective layer 109 is not corroded by the stripping solution, and thus can protect the black organic layer 107 and the photoresist layer 108 on the array layer 102. Chemical deposition and physical deposition have a poor step coverage ability, so that the side surface of the light-emitting element 103 cannot be completely covered, and the side of the light-emitting element 103 is exposed.

Further, the physical deposition is used to form the protective layer 109, and the physical deposition has a poorer step coverage ability, which is more conducive to formation of a discontinuous protective layer, so that the side of the light-emitting element is exposed, more conducive to the subsequent stripping of the photoresist layer on the light-emitting element.

In order to facilitate subsequent laterally stripping of the photoresist layer 108, the black organic layer 107, and the protective layer 109 from the side with a developing solution, the photoresist layer 108 at least on the side of the light-emitting element 103 may be exposed.

In this embodiment, the protective layer 109 includes a reflective layer to reflect the light incident on the backplane unit to prevent the light from entering the thin film transistor from the front, which impacting the performance of the thin film transistor. The reflective layer includes a metal layer formed on a side of the black organic layer 107 away from the array substrate 100. The metal layer is made of a material selected from at least one of aluminum, molybdenum, and copper. The metal layer is formed by sputter deposition (physical deposition). It can be understood that the reflective layer may also be composed of insulating layers with different refractive indexes, such as a stack of silicon nitride, silicon oxide, and titanium dioxide. The reflective layer may be a stack of a metal layer and an insulating layer. The insulating layer is formed by chemical deposition.

Further, the protective layer 109 further includes an inorganic insulating layer formed between the reflective layer and the black organic layer. The inorganic insulating layer is a silicon nitride layer to further protect the black organic layer 107 on the array layer 102.

S103: laterally stripping the photoresist layer on the light-emitting element with a stripping solution to obtain the backplane unit.

Figure 3E:
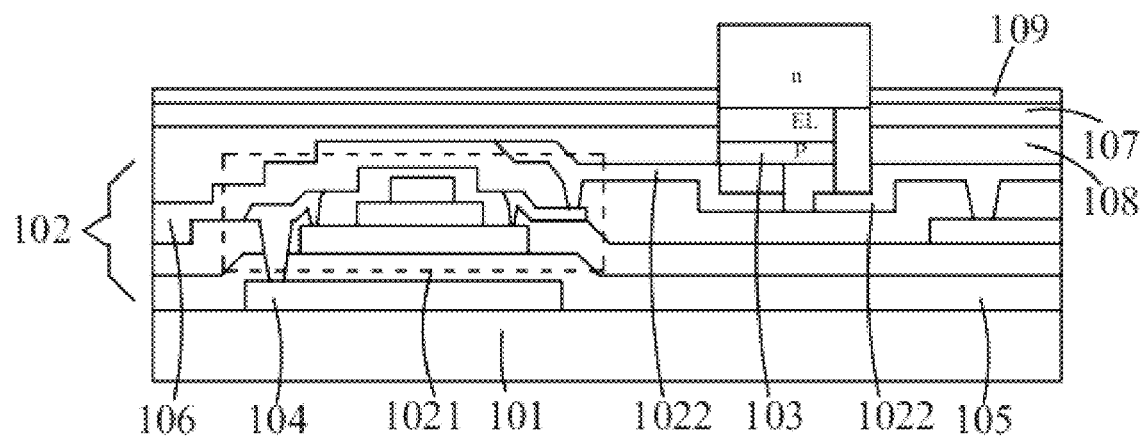

Specifically, as shown in FIG. 3E, the side surface of the light-emitting element 103 is permeated and peeled off with a stripping solution. Since a step different is present between the surface of the light-emitting element 103 away from the array layer 102 and a layer on the array layer 102, the photoresist layer 108 can be partially peeled off. The black organic layer 107 and the photoresist layer 108 on the array layer 102 are protected by the protective layer 109, so the stripping solution on the array layer 102 strips off the photoresist layer 108 on the array layer 102. The stripping solution laterally penetrates from the side the light-emitting element 103 and passes through to the photoresist layer 108 after exposure treatment, so that the photoresist layer 108, the black organic layer 107, and the protective layer 109 on the light-emitting element 103 are removed, and the light-shielding layer is patterned without a mask. Moreover, since the light-emitting element 103 is provided with a conductive electrode 1022 before the black organic layer is formed, the conductive electrode 1022 will not be corroded by the stripping solution, and will not undergo a high-temperature baking process, nor subjected to oxidize of a copper layer on the conductive electrode. In addition, the method of manufacturing the backplane unit according to the present application can also avoid corrosion of the metal pins on the array substrate configured to bind the driving chip.

In this embodiment, the stripping solution includes monoethanolamine and dimethyl sulfoxide, wherein the dimethyl sulfoxide has a swelling effect on the photoresist layer after exposure, and the monoethanolamine plays a role od infiltrating an interface between the photoresist layer and the light-emitting element to detach and dissolve the photoresist layer, which cooperate to realize the peeling of the photoresist layer. In addition, the choice of stripping solution will not cause corrosion.

It should be noted that through verification through experiments, it can been seen that the stripping solution laterally penetrates and strips the photoresist layer without causing corrosion to the light-emitting element 103.

The present application also provides a backplane unit. The backplane unit may be a backlight module or a display panel. When the backplane unit is a backlight module, the light-emitting element is a sub-millimeter light-emitting diode (mini-LED), and the backlight module serves as a backlight source to provide backlight. When the backplane unit is a display panel, the backplane unit is used for display, and the light-emitting element is a micro-light-emitting diode. The backplane unit includes an array substrate, a photoresist layer and a light-shielding layer.

Specifically, the light-emitting element is a sub-millimeter light-emitting diode, and the backplane unit is a backlight module.

The array substrate includes a substrate, an array layer, and a light-emitting element. The array layer is disposed on the substrate, and the light-emitting element is disposed on the array layer. The composition of the array layer is as described above and will not be described in detail herein for brevity.

The photoresist layer is formed on the side of the array layer away from the substrate.

In this embodiment, the light-shielding layer includes a protective layer, and the protective layer includes a reflective layer to reflect light incident on the backplane unit, such that the light is prevented from entering the thin film transistor and impacting the performance of the thin film transistor. Furthermore, when the backplane unit is a display panel, the reflective layer can improve the reflectance/external quantum efficiency.

In this embodiment, the light-shielding layer may further include a black organic layer disposed between the protective layer and the photoresist layer, so as to reduce the step difference between a top of the light-emitting element and the light-shielding layer, and facilitate subsequent packaging of the light-emitting element.

In this embodiment, the reflective layer includes a metal layer formed on a side of the black organic layer away from the array substrate.

The present application also provides a display device including the above-mentioned backplane unit.

The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A method of manufacturing a backplane unit, comprising the following steps:
forming a photoresist layer on an array substrate, wherein the array substrate comprises a substrate, an array layer, and a light-emitting element, the array layer is formed on the substrate, the light-emitting element is disposed on the array layer, and the photoresist layer is formed on a side of the array layer and the light-emitting element away from the substrate;
performing exposure on an entire surface of the photoresist layer corresponding to the light-emitting element;
forming a light-shielding layer on at least a side of the photoresist layer away from the array substrate, wherein the light-shielding layer exposes at least a side portion of the light-emitting element; and
laterally stripping the photoresist layer on the light-emitting element with a stripping solution to obtain the backplane unit.

2. The method of manufacturing the backplane unit according to claim 1, wherein a cross section of the portion of the photoresist layer corresponding to the light-emitting element has a shape of an inverted trapezoid.

3. The method of manufacturing the backplane unit according to claim 1, wherein the step of forming the light-shielding layer on at least a side of the photoresist layer away from the array substrate comprises the following step:
forming a protective layer on the at least one side of the photoresist layer away from the array substrate, wherein the protective layer comprises a reflective layer.

4. The method of manufacturing the backplane unit according to claim 3, wherein the protective layer is formed by at least one of chemical deposition and physical deposition.

5. The method of manufacturing the backplane unit according to claim 3, wherein the reflective layer is a metal layer.

6. The method of manufacturing the backplane unit according to claim 1, wherein the step of forming the light-shielding layer on at least a side of the photoresist layer away from the array substrate comprises the following step:
forming a black organic layer on the side of the photoresist layer away from the array substrate, and a sum of a thickness of the black organic layer and a thickness of the photoresist layer is smaller than a height of the light-emitting element.

7. The method of manufacturing the backplane unit according to claim 1, wherein the stripping solution comprises monoethanolamine and dimethyl sulfoxide.

8. The method of manufacturing the backplane unit according to claim 1, wherein the light-emitting element is any one of a sub-millimeter light-emitting diode, a micro-light-emitting diode, and a light-emitting diode.

9. The method of manufacturing a backplane unit according to claim 1, wherein a thickness of the photoresist layer ranges from 1 micrometer to 5 micrometers.

10. A backplane unit, comprising an array substrate, a photoresist layer, and a light-shielding layer, wherein
the array substrate comprises a substrate, an array layer, and a light-emitting element, the array layer is disposed on the substrate, and the light-emitting element is disposed on the array layer;
the photoresist layer is formed on a side of the array layer away from the substrate; and
the light-shielding layer comprises a protective layer and covers the photoresist layer, and the protective layer comprises a reflective layer.

11. The backplane unit according to claim 10, wherein the light-shielding layer further comprises a black organic layer disposed between the protective layer and the photoresist layer.

12. The backplane unit according to claim 11, wherein a sum of a thickness of the black organic layer and a thickness of the photoresist layer is smaller than a height of the light-emitting element.

13. The backplane unit according to claim 12, wherein the thickness of the black organic layer ranges from 0.8 micrometers to 1.2 micrometers, and the thickness of the photoresist layer ranges from 1 micrometer to 5 micrometers.

14. The backplane unit according to claim 10, wherein the backplane unit is a display panel or a backlight module.

15. A display device, wherein the display device comprises a backplane unit, and the backplane unit comprises an array substrate, a photoresist layer, and a light-shielding layer;
the array substrate comprises a substrate, an array layer, and a light-emitting element, the array layer is formed on the substrate, and the light-emitting element is disposed on the array layer;
the photoresist layer is formed on a side of the array layer and the light-emitting element away from the substrate; and
the light-shielding layer comprises a protective layer and covers the photoresist layer, and the protective layer comprises a reflective layer.

16. The display device according to claim 15, wherein the light-shielding layer further comprises a black organic layer disposed between the protective layer and the photoresist layer.

17. The display device according to claim 16, wherein a sum of a thickness of the black organic layer and a thickness of the photoresist layer is smaller than a height of the light-emitting element.

* * * * *